United States Patent [19]
Golane

[11] Patent Number: 5,354,950
[45] Date of Patent: Oct. 11, 1994

[54] ELECTROSTATIC SHIELDING SHEET FOR MAKING A BOX USED FOR SHIPPING AND STORING ELECTRONIC COMPONENTS AND A SHIPPING BOX MADE THEREOF

[75] Inventor: Meir Golane, Engen, Fed. Rep. of Germany

[73] Assignee: Firma Wolfgang Warmbier Systeme gegen Elektrostatik, Singen, Fed. Rep. of Germany

[21] Appl. No.: 885,267

[22] Filed: May 18, 1992

[30] Foreign Application Priority Data

Mar. 4, 1992 [DE] Fed. Rep. of Germany ... P4206727.8

[51] Int. Cl.$^5$ .............................................. H05K 9/00
[52] U.S. Cl. .............................. 174/35 MS; 174/35 R; 428/615; 428/621; 428/623; 361/818; 361/816
[58] Field of Search .................. 174/35 R, 35 MS; 361/424, 816, 817, 818; 428/68, 71, 75, 615, 621–626

[56] References Cited

U.S. PATENT DOCUMENTS 4,553,190 11/1985 Mueller ................................. 361/212
5,110,669 5/1992 Knobel et al. ....................... 428/215

*Primary Examiner*—Gregory D. Thompson
*Assistant Examiner*—Bot Ledynh
*Attorney, Agent, or Firm*—Bachman & LaPointe

[57] ABSTRACT

An electrostatic shielding material sheet (10) for making a shipping box (12, 12a) to enclose and protect electronic components and/or assemblies—and the box itself—is characterized by different layers (14, 16, 18, 20) forming an electrostatic shielding material sheet (10), one layer (16) thereof being highly conductive with a surface resistivity of less than $1 \times 10^4$ Ohm/sq—preferably $10^2$ to $10^3$ Ohm/sq—and being allocated to electrostatic dissipative layers (14, 18) with a surface resistivity of between $1 \times 10^5$ Ohm/sq and $1 \times 10^{12}$ Ohm/sq. The highly conductive layer (16) is sandwiched between electrostatic dissipative layers (14, 18) or embedded in one of the other layers (14, 18, 20). Additionally, the electrostatic shielding layer (16) shall contain highly conductive fibers.

14 Claims, 1 Drawing Sheet

ELECTROSTATIC SHIELDING SHEET FOR MAKING A BOX USED FOR SHIPPING AND STORING ELECTRONIC COMPONENTS AND A SHIPPING BOX MADE THEREOF

BACKGROUND OF THE INVENTION

This invention relates to an electrostatic shielding sheet for making a box used for shipping and storing electronic components and/or assemblies. The invention comprises a shipping box made thereof, too.

Specialty industries as aerospace, electronics, chemistry, medicine and the like are in need of electrostatic shielding packaging materials as well as a packaging for the shipping and the storing of ESD sensitive products which may be harmed by Electrostatic Discharge (ESD) during storage and shipping. ESD has become an increasing threat to electronic components, subassemblies and assemblies. With the decreasing geometry of VLSI circuits (Very Large Scale Integration), Mos technology and circuit speed performance, today's electronic components may be harmed by ESD of less than 2000 Volts. Electrostatic discharges may cause a total failure of the device and even worse they may lead to latent failures which reduce the reliability and the functionality of the circuits. It is a major goal for the industries cited above to prevent damage caused by ESD by using a protective packaging. Built-in circuitry for ESD protection is limited by chip size and speed.

For these objects, a normal cardboard is on the market which is coated on one side—or both sides—with a black, carbon loaded and conductive, thin layer which—applied to the cardboard—provides an electrostatic shielding. This black conductive coated cardboard does not meet all the requirements needed from a safe electrostatic shielding packaging; it may cause contamination of the circuits by conductive Carbon black particles which may be deposited on the circuits during the handling of the circuits and the boxes as well as malfunctions. Because of the nature and the thickness of the Carbon black conductive coating, the shielding effectiveness is not high enough to eliminate or to attenuate the ESD level found in non ESD protected areas as shipping; finally, the black conductive coated cardboard cannot be recycled with normal cardboard and must be processed seperately as it needs special treatment to get rid of the Carbon black coating.

Knowing this prior art, it has been an object of the inventor to provide a material sheet of the above mentioned kind avoiding the known failings of which shipping boxes and containers in a wide variety of sizes and shapes can be made with electrostatic dissipative and electrostatic shielding properties to protect electronic products according to the recommendations of the European ESD standard CECC-00015/1. Additionally, an environmentally responsible material shall be created which can be recycled with normal cardboard.

DETAILED DESCRIPTION

The material according to the independent patent claim solves this problem; the subclaims state further preferred embodiments.

The present invention provides a multilayer material sheet for purposes of packaging in which at least one layer is highly conductive with a surface resistivity of less than $1 \times 10^4$ Ohm/sq—preferably $1 \times 10^2$ to $1 \times 10^3$ Ohm/sq—and lays between electrostatic dissipative or derivating layers with a surface resistivity of between $1 \times 10^5$ Ohm/sq and $1 \times 10^{12}$ Ohm/sq. These electrostatic dissipative or derivating layers may also be coated or printed.

This material is free of particle contamination during the handling and can be recycled with normal cardboards.

It turned out to be favourable to add highly conductive fibers to the electrostatic shielding layer; a material consisting of paper or nonwoven fabric with a loading of 2% to 65%, preferably 5% to 25%, of highly conductive fibers is especially preferable.

According to a further feature of the invention, the highly conductive fibers shall consist of a conducting alloy or a metal, preferably carbon, Fe, Ag, Cu, Cr or the like. Fibers of copper or a copper alloy of a diameter of not more than 100 microns, preferably 20 microns, and especially a length between about 5 and 75 mm are used in the shielding layer of a special embodiment.

Within the scope of this invention, shipping boxes made of the said material sheet shall be independently protected; for preventing the wrapped packed products from damages caused by ESD the material has the effect of a "Faraday cage" shielding the packed products against electrostatic fields. This electrostatic shielding will attenuate the electrostatic fields to less than 100 to 50 Volts.

The material sheet and the thereof made shipping box respectively according to the present invention prevent the generation of a triboelectric or frictional electric charge, i.e. the static charging caused by friction between the packaging material and its content. The material used for packing according to the present invention is free of conducting, contaminating particles.

The material provides also a good mechanical protection for the electronic components.

DESCRIPTION OF THE DRAWINGS

Further advantages, features and details according to the present invention result from the following description of preferred embodiments as well as from the drawings, in which.

DETAILED DESCRIPTION

Figure 1:
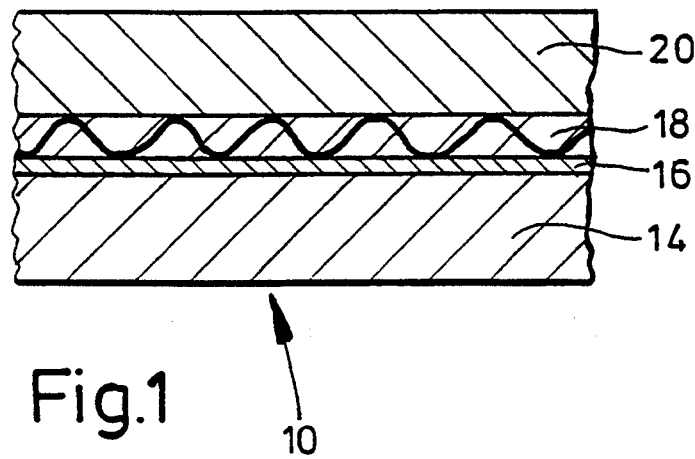
FIG. 1: is a condensed cross-sectional view through the sheet of material according to the present invention.

A sheet of material 10 for making shipping boxes 12 consists according to FIG. 1 of a lower layer 14 being a white test-liner, topped with a highly conductive shielding paper layer 16 which, in another embodiment may be a nonwoven fabric. The paper layer/nonwowen fabric is topped by a fluted brown test-liner 18, which is topped by a so-called craft-liner 20.

The craft-liner 20 of 120 to 150 gr/sq meter is an electrostatic dissipative material with a surface resistivity between $1 \times 10^5$ Ohm/sq and $1 \times 10^{12}$ Ohm/sq. This craft-liner may also be coated with a not shown covering and be printed.

The layer 16 consists—as mentioned—of a highly conductive electrostatic shielding paper or nonwoven fabric with a loading of 2% to 65% especially 5% to 25%, of a highly conductive fiber. The latter is preferably made of a copper compound with a diameter of less than 20 microns and a length of 5 to 75 mm.

For this shielding layer 16 other metals or metal alloys may also be used such as carbon, Fe, Ag, Cu, Cr or the like. The surface resistivity of this electrostatic shielding 16 is between $1 \times 10^2$ Ohm/sq and $1 \times 10^3$ Ohm/sq. The brown test-liner 18 above layer 16 is of 112 to 120 gr/sq.meter in the shape of B flute, E flute or F flute.

Naturally, instead of the—preferred unbleached—brown paper material or flute cardboard, another coloration may be used.

The white test-liner 14 of approximately 150 gr/sq. meter is an electrostatic dissipative material with a surface resistivity of between $1 \times 10^5$ Ohm/sq and less than $1 \times 10^{12}$ Ohm/sq.

For achieving the electrostatic shielding properties of the material sheet 10, the position of the highly conductive electrostatic shielding layer 16 within the overall material construction is of minor importance; the electrostatic shielding layer 16 can be placed between the craft-liner 20 and the fluted test-liner 18 or between the latter and the white test-liner 14. Also layer 16 could be embedded inside the brown test-liner 18 or the white test-liner 14 during the manufacturing of the material sheet 10.

Figure 2:
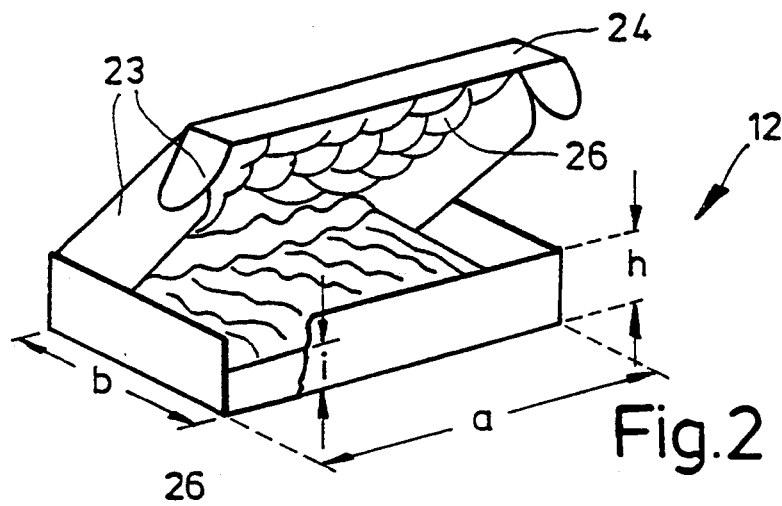
FIG. 2 and FIG. 3: are diagonal views of different embodiments of an open shipping box made of a sheet of material according to the present invention.

According to FIG. 2, a cuboid shipping box 12 made from the material sheet 10—consisting of a bottom 22 and a lift-up lid 24 with lateral tongues 23 linked to it—of a length a of about 190 mm, a width b of about 130 mm and of a height h of 35 mm is lined with two antistatic soft foam inserts 26 to enhance mechanical protection for a packed product not shown for reasons of clearness. The height i of the foam inserts 26 made from the described material for shielding layer 16 is about 15 mm.

Figure 3:
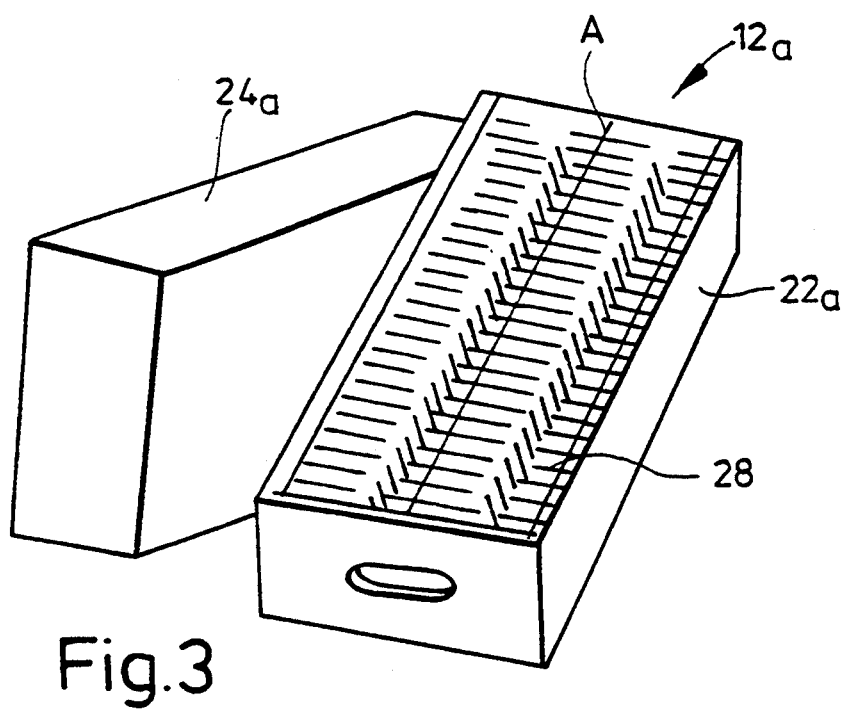

The shipping box 12a of FIG. 3 consisting of bottom 22a and removable lid 24a contains transversal inserts 28 inserted transversaly to its axis A.

Inside the shipping boxes 12 described in FIG. 2 a populated printed circuit board fitted with 3 ESD event detectors with trigger voltages of 50 Volts, 100 Volts and 150 Volts respectively was inserted. The shipping box 12 was laid on a grounded plane of a diameter of about 127 mm and a metal plate of a corresponding size was laid on top of the shipping box to cover the 3 ESD event detectors. An ESD event simulator (Human Body Model; C=100 pf, R=1500 Ohm with variable output from 10 to 5000 Volts) was used to simulate an ESD event. Then Voltages ranging from 100 to 5000 Volts were applied to the center of the plate laid on top of the lift-up lid 24 in 500 Volts increment. After each discharge the box 12 was opened to see if the ESD event detectors have been triggered. It was found out that for all the testing voltages all the ESD event detectors remained in their original—untriggered—state. This procedure simulates a real life situation where shipping box and its content may be subjected to ESD in the non ESD protected areas.

For comparison purposes, the same test was performed with black—carbon coated—cardboard boxes from various sources. All the boxes had the same size as the one described in the test above, and the tests were performed under the same conditions. In all the black cardboard boxes tested the ESD event detectors were triggered at voltages ranging between 1000 and 2000 Volts.

What I claim is:

1. An electrostatic shielding sheet material formed of a plurality of layers comprises a first layer of conductive material having a surface resistivity of less than $1 \times 10^4$ ohm/sq sandwiched between a second layer material and a third layer material, said second and third layer materials having a surface resistivity of between $1 \times 10^5$ to $1 \times 10^{12}$ ohm/sq and said layer of conductive material being made of paper and loaded with 2% to 65% highly conductive fibers.

2. A material sheet according to claim 1 wherein the highly conductive fibers are selected from the group consisting of carbon, Fe, Ag, Cu, Cr and alloys thereof.

3. A material sheet according to claim 2 wherein the highly conductive fibers have a diameter of not greater than 100 microns.

4. A material sheet according to claim 1 wherein the highly conductive fibers are selected from the group ;consisting of copper and copper alloys and have a diameter of not greater than 100 microns.

5. A material sheet according to claim 4 wherein the fibers are made from copper or a copper alloy of a diameter not greater than 20 microns in the shielding layer.

6. A material sheet according to claim 3 wherein the fibers are made from copper or a copper alloy of a diameter not greater than 20 microns in the shielding layer.

7. A material sheet according to claim 1 wherein conductive material layer is made of a paper with a loading of 5% to 25% of highly conductive fibers.

8. A shipping box made of an electrostatic shielding sheet material comprises a first layer of conductive ;material having a surface resistivity of less than $1 \times 10^4$ ohm/sq. sandwiched between a second layer material and a third layer material, said second and third layer materials having a surface resistivity of between $1 \times 10^5$ to $1 \times 10^{12}$ ohm/sq. and said layer of conductive material being made of paper and loaded with 2% to 65% highly conductive fibers.

9. A shipping box according to claim 8 wherein the highly conductive fibers are selected from the group consisting of carbon, Fe, Ag, Cu, Cr and alloys thereof.

10. A shipping box according to claim 9 wherein the highly conductive fibers have a diameter of not greater than 100 microns.

11. A shipping box according to claim 9 wherein the fibers are made from copper or a copper alloy of a diameter not greater than 20 microns in the shielding layer.

12. A shipping box according to claim 8 wherein the highly conductive fibers are selected from the group consisting of copper and copper alloys and have a diameter of not greater than 100 microns.

13. A shipping box according to claim 8 wherein the fibers are made from copper or a copper alloy of a diameter not greater than 20 microns in the shielding layer.

14. A shipping box according to claim 8 wherein conductive material layer is made of a paper with a loading of 5% to 25% of highly conductive fibers.

* * * * *